(12) United States Patent
Dang et al.

(10) Patent No.: US 12,328,116 B2
(45) Date of Patent: Jun. 10, 2025

(54) SIGNAL TRANSMISSION CIRCUITRY AND SNUBBER CIRCUITRY

(71) Applicants: Kabushiki Kaisha Toshiba, Tokyo (JP); Toshiba Electronic Devices & Storage Corporation, Tokyo (JP)

(72) Inventors: Bowen Dang, Kawasaki Kanagawa (JP); Makoto Arai, Tokyo (JP); Shoji Ootaka, Yokohama Kanagawa (JP); Takeshi Murasaki, Yokohama Kanagawa (JP); Takaya Kitahara, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 113 days.

(21) Appl. No.: 18/237,835

(22) Filed: Aug. 24, 2023

(65) Prior Publication Data
US 2024/0322820 A1 Sep. 26, 2024

(30) Foreign Application Priority Data
Mar. 24, 2023 (JP) .................. 2023-048492

(51) Int. Cl.
  *H03K 17/691* (2006.01)
  *H02M 1/34* (2007.01)
(52) U.S. Cl.
  CPC ............ *H03K 17/691* (2013.01); *H02M 1/34* (2013.01)

(58) Field of Classification Search
  CPC .................................................. H03K 17/691
  USPC ................................................... 327/108
  See application file for complete search history.

(56) References Cited

U.S. PATENT DOCUMENTS

| 6,487,092 | B2* | 11/2002 | Nishikawa | ........ | H02M 3/33571 363/17 |
| 9,673,715 | B2* | 6/2017 | Hasegawa | ......... | H02M 3/33569 |

FOREIGN PATENT DOCUMENTS

| JP | H11-262240 A | 9/1999 |
| JP | 2001-333576 A | 11/2001 |
| JP | 6193029 B2 | 9/2017 |

* cited by examiner

*Primary Examiner* — Tomi Skibinski
(74) *Attorney, Agent, or Firm* — Kim & Stewart LLP

(57) ABSTRACT

A signal transmission circuitry is a circuitry that transmits a signal from a first system on a transmission side to a second system on a reception side. The first system includes an inductor, a first current source controlled by a first switch, a second current source connected in series with the first current source via the inductor and controlled by a second switch, a third switch connected in parallel with the first current source and controlling connection with a ground point, and a fourth switch connected in parallel with the second current source and controlling connection with the ground point.

7 Claims, 5 Drawing Sheets

SIGNAL TRANSMISSION CIRCUITRY AND SNUBBER CIRCUITRY

This application is based upon and claims the benefit of priority from the Japanese Patent Application No. 2023-048492, filed on Mar. 24, 2023, the entire contents of which are incorporated herein by reference.

FIELD

Embodiment of the present invention relates to a signal transmission circuitry and a snubber circuitry.

BACKGROUND

In a digital isolator or the like, non-contact type signal transmission and reception via an inductor is executed. In these circuitries, a center tap is provided between the inductors to suppress an excessive current from flowing through the circuitry. On the other hand, for example, there is a case where the center tap is not arranged due to downsizing of the device, but in a case where such a center tap is not arranged, a problem that a current flows in the snubber circuitry on a transmission side may occur.

DETAILED DESCRIPTION

According to one embodiment, a signal transmission circuitry is a circuitry that transmits a signal from a first system on the transmission side to a second system on a reception side. The first system includes an inductor, a first current source controlled by a first switch, a second current source connected in series with the first current source via the inductor and controlled by a second switch, a third switch connected in parallel with the first current source and controlling connection with a ground point, and a fourth switch connected in parallel with the second current source and controlling connection with the ground point.

Hereinafter, embodiments will be described with reference to the drawings.

Figure 1:
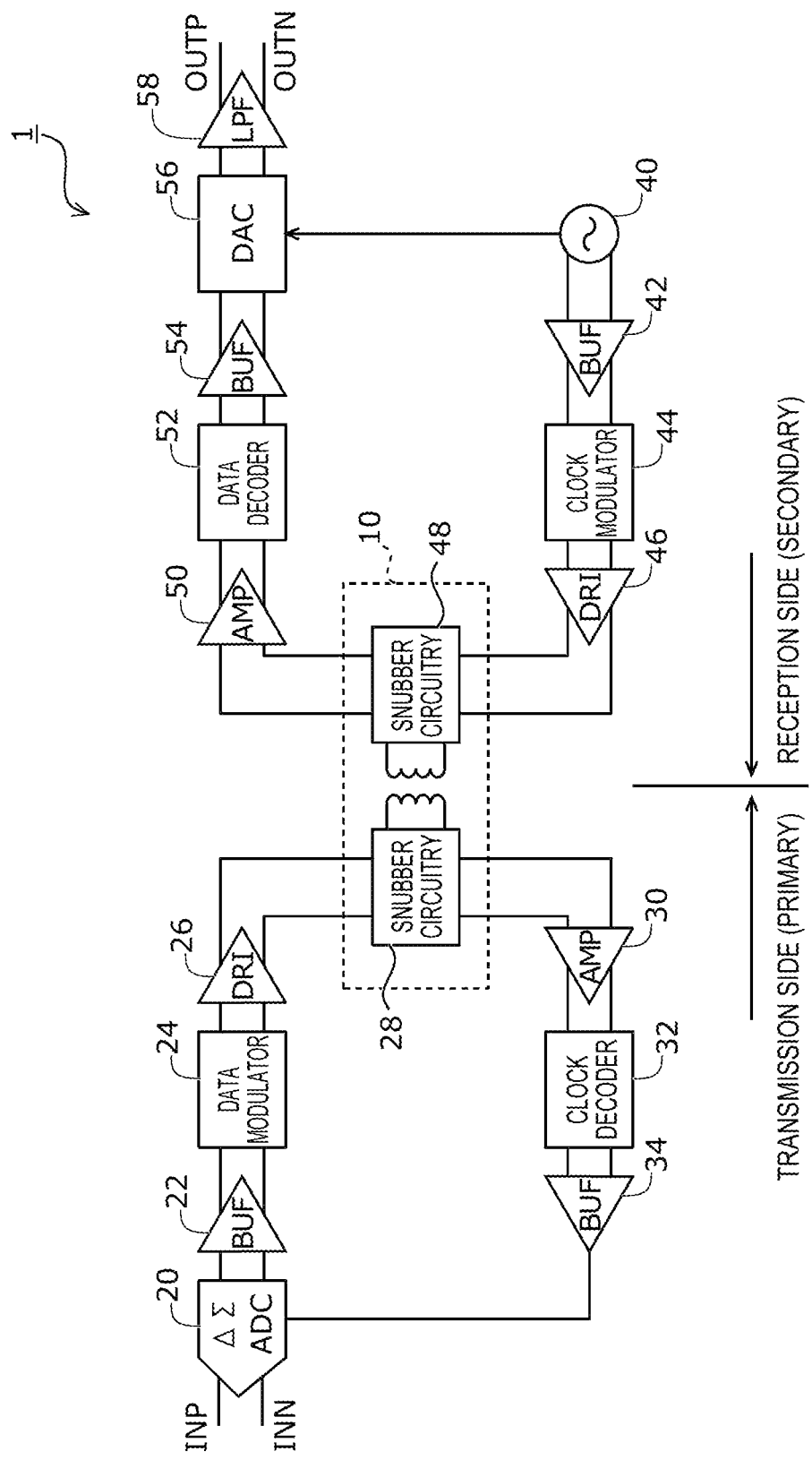
FIG. 1 is a diagram schematically illustrating an example of a digital isolator according to an embodiment.

FIG. 1 is a diagram illustrating an example of a digital isolator according to an embodiment. The embodiments described in the present disclosure can be applied to such a general digital isolator.

A digital isolator 1 is a circuitry that rectifies a differential signal (an input differential signal INP/INN) input from a primary side (the first system side) through an insulated region of the input differential signal and outputs the rectified differential signal (an output differential signal OUTP/OUTN) to a secondary side (the second system side) by using a inductor. The digital isolator 1 transmits the rectified signal via a transformer unit 10.

The differential signal input to the first system (the transmission side, the primary side) is subjected to $\Delta\Sigma$ modulation in a $\Delta\Sigma$ modulator 20, subjected to data modulation in a data modulator 24 via a buffer 22 as necessary, and input to a snubber circuitry 28 via a driver 26.

The snubber circuitry 28 is provided in the transformer unit 10, a signal in which noise is controlled is propagated to the inductor through the snubber circuitry 28 in the first system, and the signal propagated to the second system by the inductor is output through a snubber circuitry 48 in the second system with the noise of high wavelength suppressed.

The signal output in the first system is amplified by an amplifier 30, decoded by a clock decoder 32, and fed back to the $\Delta\Sigma$ modulator 20 via a buffer 34 as necessary.

On the second system side (the reception side, the secondary side), the signal received through the snubber circuitry 48 in the transformer unit 10 is amplified in an amplifier 50, the data is decoded in a data decoder 52, the digital signal is converted into the analog signal in a DAC 56, and the analog signal is output through a filter such as a low-pass filter 58 as necessary.

On the second system side, a clock signal is generated by a signal generator 40, a clock modulator 44 performs clock modulation based on the clock signal and controls the snubber circuitry 48 via a driver 46, and the inductor appropriately converts, by executing conversion of a digital-analog signal in the DAC 56 using the clock signal, the received signal into an analog signal and outputs the analog signal.

In the present disclosure, a snubber circuitry without a center tap that prevents a current that can be generated in the transformer unit 10 from flowing to an undesirable path will be described.

First Embodiment

The transformer unit 10 includes a snubber circuitry, a primary-side inductor that transmits and receives signals in an isolated state, and a secondary-side inductor.

Figure 2:
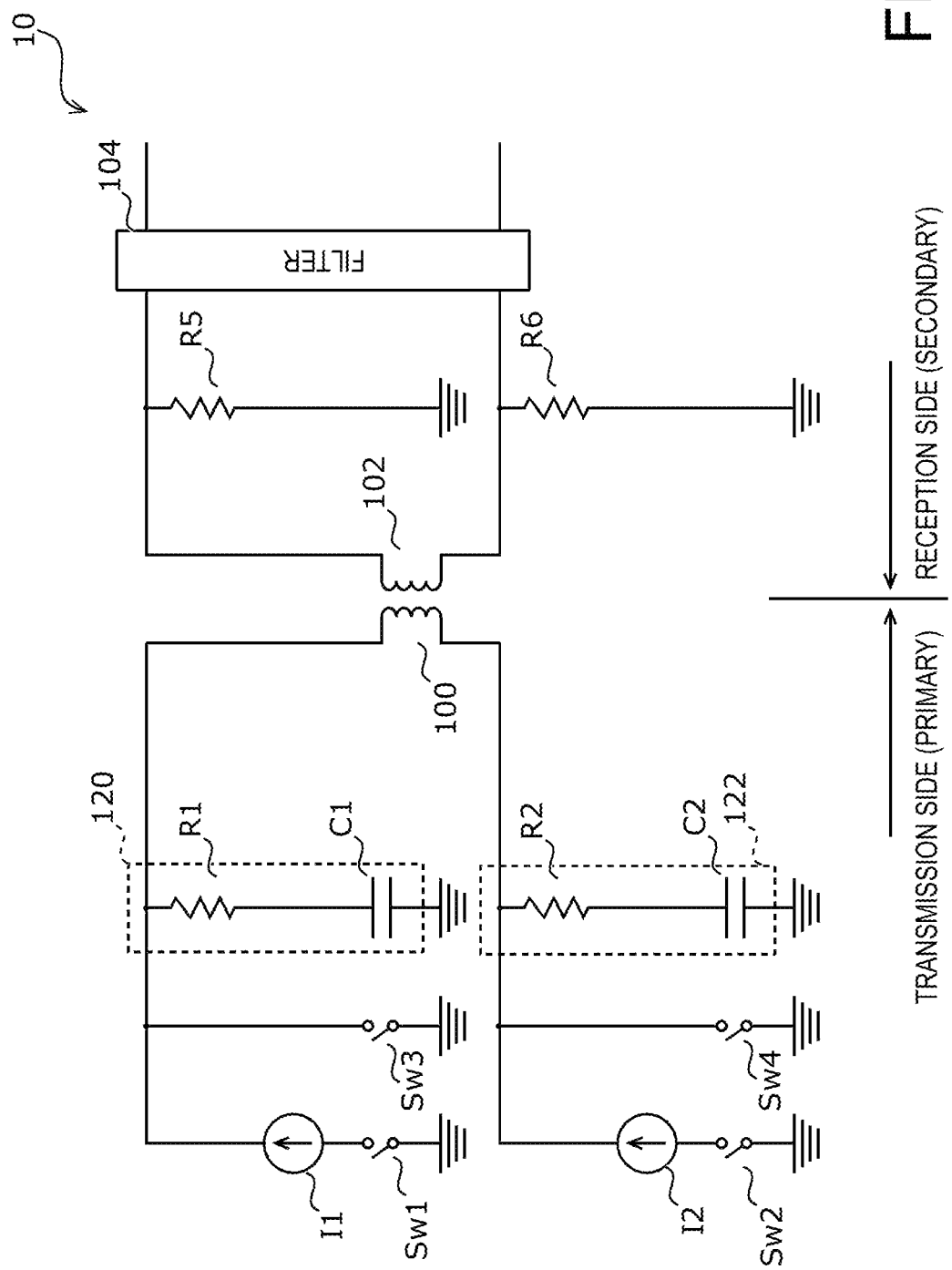
FIGS. 2 to 5 are diagrams schematically illustrating an example of a transformer unit according to an embodiment.

FIG. 2 is a circuit diagram schematically illustrating an example of a transformer unit according to an embodiment. The transformer unit 10 includes inductors 100 and 102, switches Sw1, Sw2, Sw3, and Sw4, current sources I1 and I2, resistors R1, R2, R5, and R6, capacitors C1 and C2, and a filter 104.

The current source I1 is connected to one end of the inductor 100 and is connected to a ground point via the switch Sw1. When the switch Sw1 is turned on/off, a signal is transmitted to the inductor 100 by the current output from the current source I1.

The switch Sw1 is connected between the current source I1 and the ground point. The signal transmitted from the first system to the second system is converted by the driver 26 in FIG. 1 to turn on/off the switch Sw1.

The current source I2 is connected to the other end of the inductor 100 and is connected to the ground point via the switch Sw2. When the switch Sw2 is turned on/off, a signal is transmitted to the inductor 100 by the current output from the current source I2.

The switch Sw2 is connected between the current source I2 and the ground point. The signal transmitted from the first system to the second system is converted by the driver 26 in FIG. 1 to turn on/off the switch Sw2.

The driver 26 generates a drive voltage of each switch so that the switch Sw1 appropriately conducts with respect to the signal in the positive direction of the differential signal and the switch Sw2 appropriately conducts with respect to the signal in the negative direction of the differential signal, and drives each switch.

The signal transmitted and received via the insulation is converted into a signal using a pulse signal by, for example, the data modulator 24 in FIG. 1. By performing the conversion in this manner, the switches Sw1 and Sw2 are turned on/off to realize transmission of signals in the positive direction and the negative direction, respectively.

In other words, the differential signal is generated by the current sources I1 and I2 and the switches Sw1 and Sw2 and transmitted to the second system via the inductors 100 and 102.

As an example, the switch Sw1 and the switch Sw2 are controlled so as not to be turned on at the same timing.

The resistor R1 and the capacitor C1 are connected in series between the one end of the inductor 100 and the ground point. The resistor R1 and the capacitor C1 form a first filter circuit 120 that operates as a part of a filter of a signal oscillated in the current source I1 and the switch Sw1. As illustrated in the drawing, the first filter circuit 120 is connected in parallel to the current source I1 and the switch Sw1. As an example, the resistor R1 and the capacitor C1 operate as a part of a low-pass filter.

The resistor R2 and the capacitor C2 are connected in series between the other end of the inductor 100 and the ground point. The resistor R2 and the capacitor C2 form a second filter circuit 122 that operates as a part of a filter of a signal oscillated in the current source I2 and the switch Sw2. As illustrated in the drawing, the second filter circuit 122 is connected in parallel to the current source I2 and the switch Sw2. As an example, the resistor R2 and the capacitor C2 operate as a part of a low-pass filter.

The switch Sw3 is connected between the one end of the inductor 100 and the ground point. The switch Sw3 is a switch that is driven in synchronization with the switch Sw2. The switch Sw3 is oscillated by the current source I2 and the switch Sw2, and causes a current to flow to the ground point so that a signal transmitted via the inductor 100 does not affect other elements of the circuit.

The switch Sw4 is connected between the other end of the inductor 100 and the ground point. The switch Sw4 is a switch that is driven in synchronization with the switch Sw1. The switch Sw4 is oscillated by the current source I1 and the switch Sw1, and causes a current to flow to the ground point so that a signal transmitted via the inductor 100 does not affect other elements of the circuit.

The current in the direction defined by the switches Sw1 and Sw2 as described above flows through the inductor 100.

The inductor 102 is an element that is disposed so as to perform mutual induction with the inductor 100 and allows a current based on a magnetic field generated by a change in the current flowing through the inductor 100 to flow.

The resistor R5 is connected between one end of the inductor 102 and the ground point.

The resistor R6 is connected between the other end of the inductor 102 and the ground point.

The filter 104 filters and propagates a potential difference between both ends based on the current generated in the inductor 102. For example, the filter 104 suppresses harmonic components (noise components) and outputs a signal.

Figure 3:
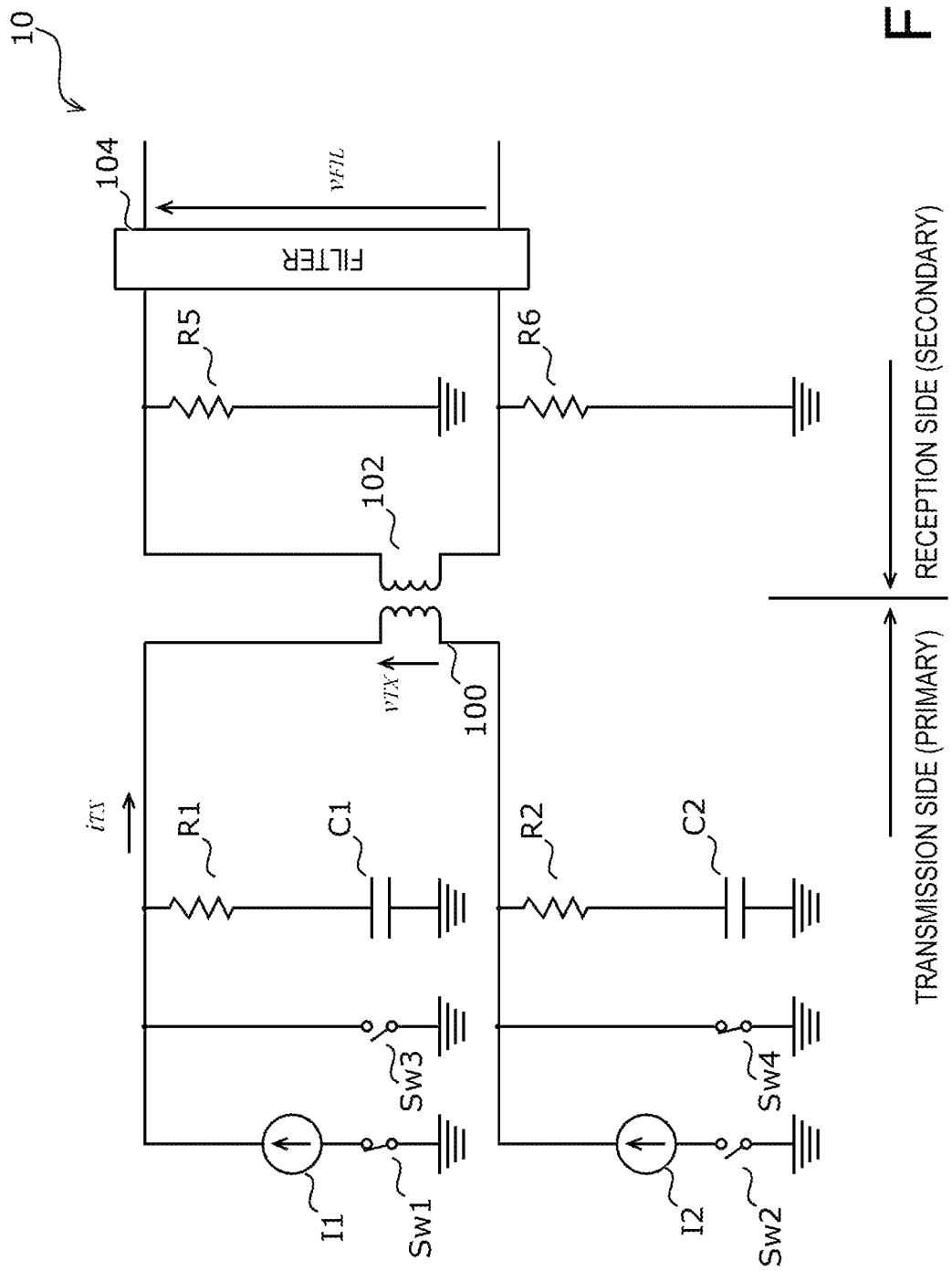

FIG. 3 is a diagram illustrating an on/off state of the switches of the transformer unit 10 according to the embodiment. As described above, the switches Sw1 and Sw4 operate in synchronization, and the switches Sw2 and Sw3 operate in synchronization. FIG. 3 is a diagram illustrating a state in which the switches Sw1 and Sw4 are turned on and the switches Sw2 and Sw3 are turned off.

At this timing, the switch Sw1 is turned on, the current generated by the current source I1 is filtered through the first filter circuit 120, and the current $i_{TX}$ flows to the inductor 100. The temporal change of the current due to the generation of the current $i_{TX}$ generates a voltage $v_{TX}$ in the inductor 100, and this pulse signal is output as a signal (voltage $v_{FIL}$) via the inductors 100 and 102 and the filter 104 via the low-pass filter.

The current that has passed through the inductor 100 flows to the ground point via the switch Sw4 that is turned on. As a result, it is possible to prevent an excessive current from flowing to other elements of the circuitry.

Even in a case where the switches Sw2 and Sw3 are synchronously turned on, the excessive current can be suppressed by the similar operation.

As described above, according to the present embodiment, by forming a path through which the current flows to the ground point in the snubber circuitry, it is possible to suppress the excessive current from flowing to unintended circuitry elements. By using this snubber circuitry, it is possible to eliminate harmonic noise while avoiding arrangement of a center tap of the inductor. As a result, it is possible to reduce the circuit area and improve the degree of freedom of the circuit layout while having characteristics equivalent to those in the case of having a center tap.

Figure 4:
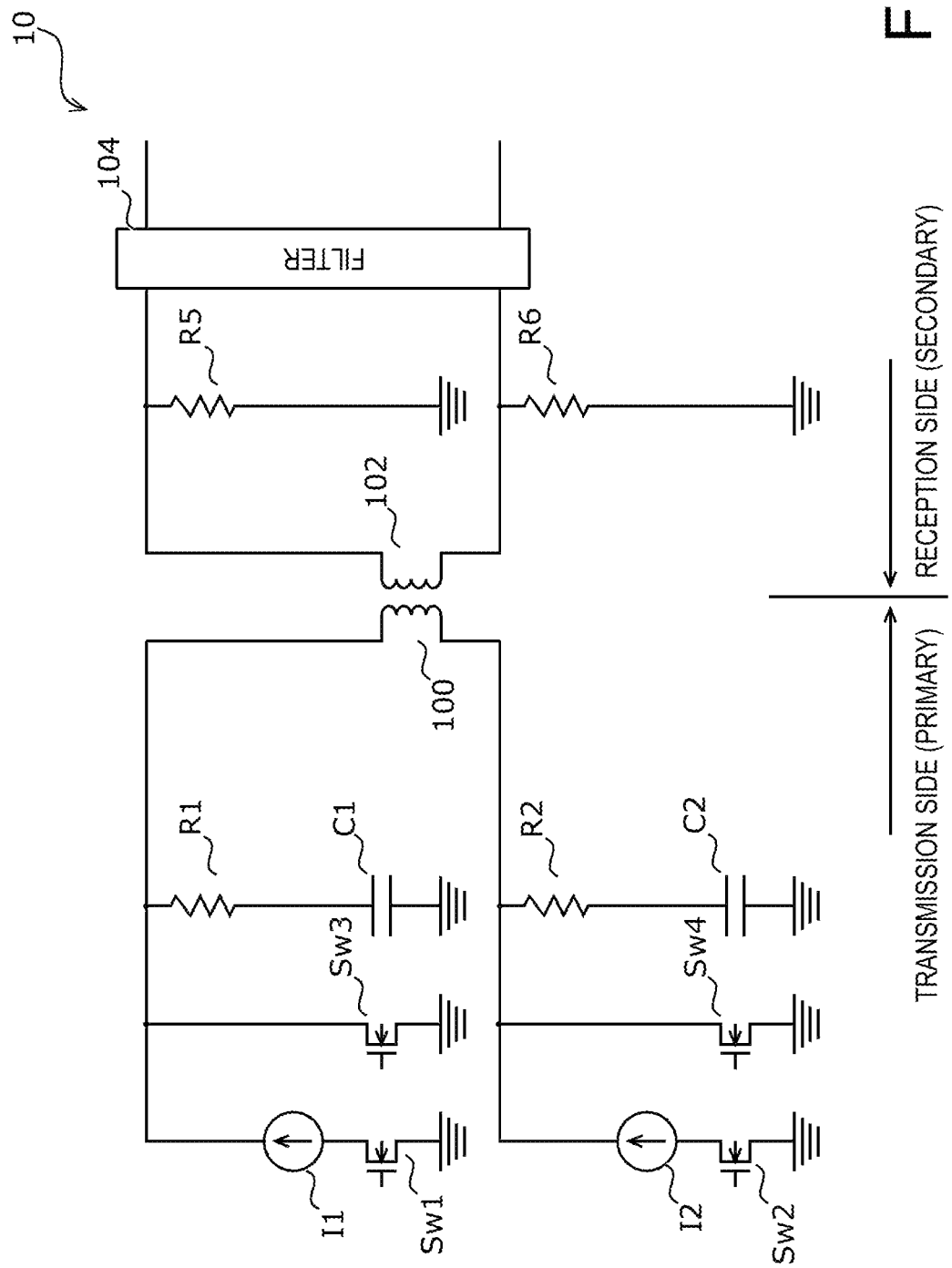

FIG. 4 is a circuit diagram illustrating an example of mounting of the transformer unit 10. As illustrated in FIG. 4, each switch may be a Metal-Oxide-Semiconductor Field-Effect Transistor (MOSFET). Each of the switches can in particular be formed of an n-type MOSFET.

Second Embodiment

Figure 5:
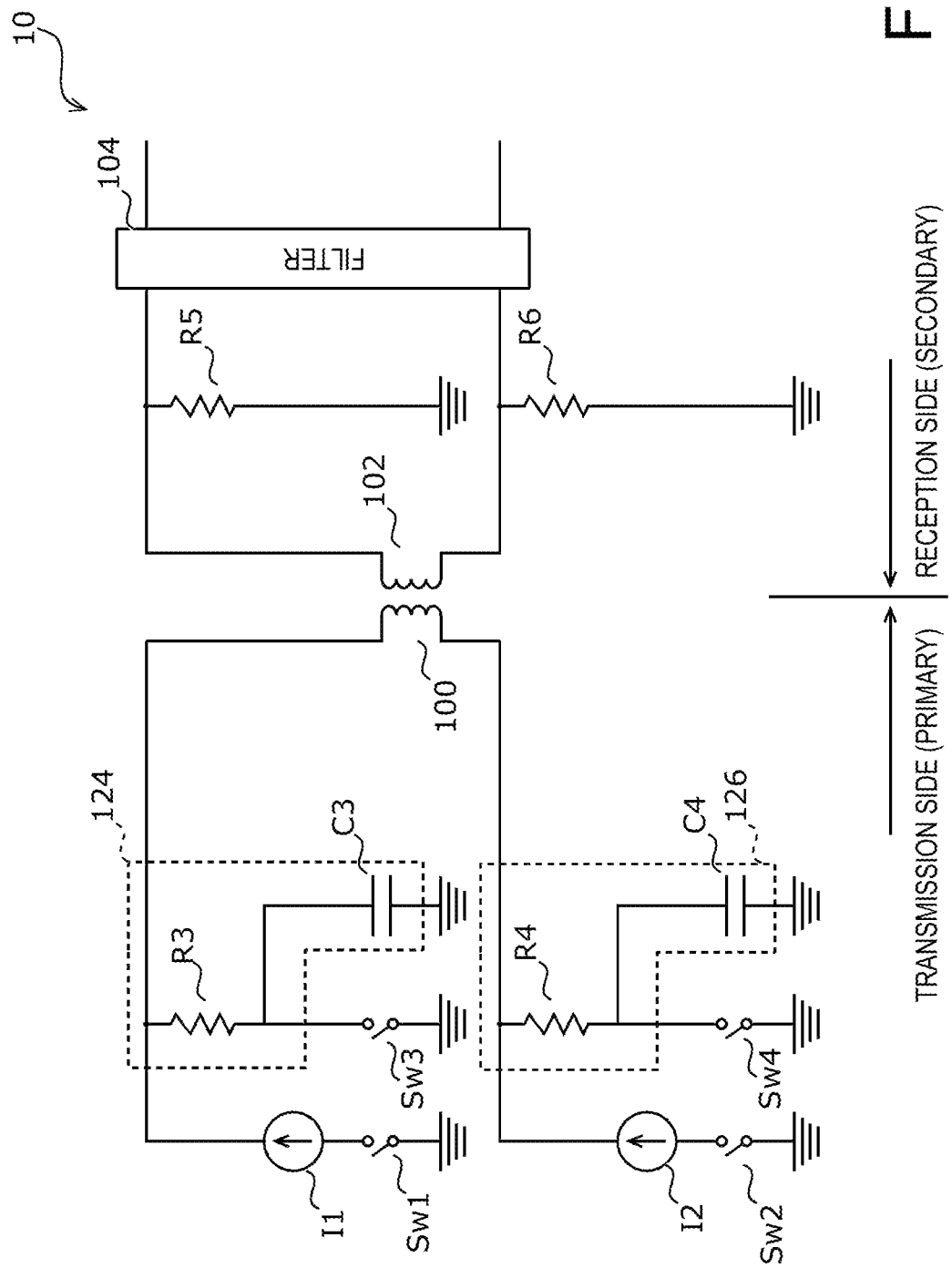

FIG. 5 is a diagram illustrating an example of the transformer unit 10 according to a second embodiment. The transformer unit 10 forms a third filter circuit 124 and a fourth filter circuit 126 instead of the first filter circuit 120 and the second filter circuit 122 in the above-described embodiment.

The third filter circuit 124 is formed of a resistor R3 and a capacitor C3 connected in series between the one end of the inductor 100 and the ground point. The resistor R3 is connected to the ground point via the switch Sw3. The capacitor C3 is connected in parallel with the switch Sw3 from a connection node with the resistor R3.

The fourth filter circuit 126 is formed of a resistor R4 and a capacitor C4 connected in series between the other end of the inductor 100 and the ground point. The resistor R4 is connected to the ground point via the switch Sw4. The capacitor C4 is connected in parallel with the switch Sw4 from a connection node with the resistor R4.

When the switches Sw1 and Sw4 are turned on, the resistor R3 and the capacitor C3 operate as a part of the filter similarly to the above-described embodiment. On the other hand, the current propagated through the inductor 100 flows to the ground point through the resistor R4 and the switch Sw4.

In this manner, the arrangement of the filter circuits and the switches may be changed.

In the above two embodiments, the filter circuits are provided on the first system side, but the present invention is not limited thereto. Even in a case where there are other circuitry elements arranged in the snubber circuitry, it is possible to suppress the excessive high-frequency current from flowing to these elements by similarly switching the switches.

In other words, the digital isolator according to the present disclosure is a circuitry that transmits a signal from the first system to the second system, and includes a snubber circuitry. The snubber circuitry may be configured to include a first current source, a first switch that controls the current flowing from the first current source, a second current source, a second switch that controls the current flowing from the second current source, a third switch that is connected in parallel with the first current source and controls connection with the ground point, and a fourth switch that is connected in parallel with the second current source and controls connection with the ground point. The first switch and the fourth switch are synchronously turned on/off, and the second switch and the third switch are synchronously turned on/off. The first switch and the second switch are exclusively turned on.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A signal transmission circuitry that is a circuitry that transmits a signal from a first system on a transmission side to a second system on a reception side, wherein
   the first system includes:
      an inductor;
      a first current source controlled by a first switch;
      a second current source connected in series with the first current source via the inductor and controlled by a second switch;
      a third switch that is connected in parallel with the first current source and controls connection with a ground point; and
      a fourth switch that is connected in parallel with the second current source and controls connection with the ground point.

2. The signal transmission circuitry according to claim 1, wherein
   the first switch and the third switch are turned on and off in synchronization with each other,
   the second switch and the fourth switch are turned on and off in synchronization with each other, and
   the first switch and the second switch are not turned on at the same timing.

3. The signal transmission circuitry according to claim 1, wherein
   the first system further includes:
      a first filter circuit connected in parallel with the third switch between one end of the inductor and the ground point; and
      a second filter circuit connected in parallel with the fourth switch between the other end of the inductor and the ground point.

4. The signal transmission circuitry according to claim 3, wherein
   the first filter circuit includes a first resistor and a first capacitor connected in series, and
   the second filter circuit includes a second resistor and a second capacitor connected in series.

5. The signal transmission circuitry according to claim 1, wherein
   the first system further includes:
      a third filter circuit partially connected in series with the third switch and partially connected in parallel with the third switch between one end of the inductor and the ground point; and
      a fourth filter circuit partially connected in series with the fourth switch and partially connected in parallel with the fourth switch between the other end of the inductor and the ground point.

6. The signal transmission circuitry according to claim 5, wherein
   the third filter includes:
      a third resistor connected in series with the third switch; and
      a third capacitor connected in parallel with the third switch and connected in series with the third resistor, and
   the fourth filter includes:
      a fourth resistor connected in series with the fourth switch; and
      a fourth capacitor connected in parallel with the fourth switch and connected in series with the fourth resistor.

7. A snubber circuitry that is a circuitry for controlling a current flowing through an inductor, the snubber circuitry comprising:
   a first current source controlled by a first switch;
   a second current source connected in series with the first current source via the inductor and controlled by a second switch;
   a third switch that is connected in parallel with the first current source and controls connection with a ground point; and
   a fourth switch that is connected in parallel with the second current source and controls connection with the ground point.

* * * * *